(12) United States Patent
Noma et al.

(10) Patent No.: US 7,101,735 B2
(45) Date of Patent: Sep. 5, 2006

(54) MANUFACTURING METHOD OF SEMICONDUCTOR DEVICE

(75) Inventors: Takashi Noma, Ota (JP); Hiroyuki Shinogi, Oizumi-machi (JP); Akira Suzuki, Ota (JP); Yoshinori Seki, Oizumi-machi (JP); Koichi Kuhara, Oizumi-machi (JP); Yukihiro Takao, Nitta-machi (JP); Hiroshi Yamada, Oizumi-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 94 days.

(21) Appl. No.: 10/696,581

(22) Filed: Oct. 30, 2003

(65) Prior Publication Data

US 2004/0137723 A1    Jul. 15, 2004

(30) Foreign Application Priority Data

Oct. 30, 2002   (JP) ............................. 2002-315418

(51) Int. Cl.
*H01L 21/44* (2006.01)
(52) U.S. Cl. .................... 438/114; 438/462; 438/465
(58) Field of Classification Search ................ 438/110, 438/112, 113, 33, 64–68, 458, 460–465; 257/620, 257/621
See application file for complete search history.

(56) References Cited

U.S. PATENT DOCUMENTS

| 6,051,489 A | 4/2000 | Young et al. |
| 6,221,751 B1 | 4/2001 | Chen et al. |
| 6,420,211 B1 * | 7/2002 | Brunet et al. ............... 438/113 |
| 6,607,941 B1 * | 8/2003 | Prabhu et al. .............. 438/113 |
| 6,753,936 B1 * | 6/2004 | Tanaka ....................... 349/106 |
| 2002/0038890 A1 | 4/2002 | Ohuchi |

FOREIGN PATENT DOCUMENTS

| EP | 1085570 | 3/2001 |
| JP | 2002-512436 A | 4/2002 |
| WO | WO-99/40624 A1 | 8/1999 |

OTHER PUBLICATIONS

Thomas Luxbacher, Ph.D., et al. (Jul. 1999) "Spray Coating for MEMS Interconnect & Advanced Packaging Applications," Fujifilm Interface, 42$^{nd}$ Interface Microlithography Symposium, 5 pages.

A. Badihi (1999) "Shellcase Ultrathin Chip Size Package," Proceedings International Symposium on Advanced Packaging Materials Processes, Properties and Interfaces, pp. 236-240.

* cited by examiner

*Primary Examiner*—Thanhha Pham
(74) *Attorney, Agent, or Firm*—Morrison & Foerster LLP

(57) ABSTRACT

A first glass substrate is bonded through a resin to a top surface of a semiconductor wafer on which a first wiring is formed. A second glass substrate is bonded to a back surface of the semiconductor wafer through a resin. A V-shaped groove is formed by notching from a surface of the second glass substrate through a part of the first glass substrate. A second wiring connected with the first wiring and extending to the surface of the second glass substrate is formed. A protection film composed of an organic resin and a photoresist layer to provide the protection film with an opening are formed on the second wiring by spray coating. A conductive terminal is formed by screen printing using the protection film as a solder mask. A cushioning material may be formed on the second glass substrate by spray coating.

19 Claims, 10 Drawing Sheets

MANUFACTURING METHOD OF SEMICONDUCTOR DEVICE

BACKGROUND OF THE INVENTION

1. Field of the Invention

This invention relates to a manufacturing method of a BGA (Ball Grid Array) type semiconductor device which has ball-shaped conductive terminals.

2. Description of the Related Art

A CSP (Chip Size Package) receives attention in recent years as a three-dimensional mounting technology as well as a new packaging technology. The CSP means a small package having about the same outside dimensions as those of a semiconductor die packaged in it.

The BGA type semiconductor device has been known as a kind of CSP. A plurality of ball-shaped conductive terminals made of metal such as solder is arrayed in a grid pattern on one principal surface of a package of the BGA type semiconductor device and is electrically connected with the semiconductor die mounted on the other side of the package.

When the BGA type semiconductor device is mounted into electronic equipment, the semiconductor die and external circuit on a printed circuit board are electrically connected by compression bonding of each of the conductive terminals to each of wiring patterns on the printed circuit board.

Such a BGA type semiconductor device has advantages in providing a large number of conductive terminals and in size reduction over other CSP type semiconductor devices such as an SOP (Small Outline Package) and a QFP (Quad Flat Package), which have lead pins protruding from their sides. The BGA type semiconductor device is used as an image sensor chip for a digital camera incorporated into a mobile telephone, for example.

FIGS. 11A and 11B show outline structure of a conventional BGA type semiconductor device. FIG. 11A is an oblique perspective figure showing a top side of the BGA type semiconductor device. And FIG. 11B is an oblique perspective figure showing a back side of the BGA type semiconductor device.

A semiconductor die 104 is sealed between a first glass substrate 102 and a second glass substrate 103 through epoxy resins 105a and 105b in the BGA type semiconductor device 101. A plurality of conductive terminals 106 is arrayed in a grid pattern on a principal surface of the second glass substrate 103, that is, on a back surface of the BGA type semiconductor device 101. The conductive terminals 106 are connected to the semiconductor die 104 through a plurality of second wirings 110. The plurality of second wirings 110 is connected with aluminum first wirings pulled out from inside of the semiconductor die 104, making each of the conductive terminals 106 electrically connected with the semiconductor die 104.

More detailed explanation on a cross-sectional structure of the BGA type semiconductor device 101 will be given hereafter referring to FIG. 12. FIG. 12 shows a cross-sectional view of the BGA type semiconductor devices 101 divided along dicing lines into individual dice.

The first wiring 107 is provided on an insulation film 108 on a top surface of the semiconductor die 104. The semiconductor die 104 is bonded to the first glass substrate 102 with the resin 105a. A back surface of the semiconductor die 104 is bonded to the second glass substrate 103 with the resin 105b.

One end of the first wiring 107 is connected to the second wiring 110. The second wiring 110 extends from the end of the first wiring 107 to a surface of the second glass substrate 103. The ball-shaped conductive terminal 106 is formed on the second wiring 110 extended onto the second glass substrate 103.

A protection film 111 of an organic resin is formed before dicing on a top surface of the BGA type semiconductor device 101 described above, which has a V-shaped groove VG (Refer to FIG. 13A.). Conventionally, the protection film 111 is formed on a surface of the second wiring 110 by facing up the back surface of the semiconductor die 104, potting a thermosetting organic resin on it and spinning a semiconductor wafer, in which the semiconductor dice 104 are formed, to spread the thermosetting organic resin on the back surface utilizing centrifugal force.

In this method, however, the thermosetting organic resin accumulates too thick in a bottom of the V-shaped groove VG around the dicing line (dashed line), as shown in FIG. 13A. It is because the thermosetting organic resin has a property of a sticky paste. As a result, the organic resin accumulated in the bottom of the V-shaped groove VG shrinks more than the organic resin covering other portion of the semiconductor device 101, when the protection film 111 is hardened by baking (heat treatment). There arises a problem that the larger shrinking in the bottom of the V-shaped groove VG causes a warping in the semiconductor wafer. (The warping in direction indicated by arrows in FIG. 13B is caused.)

The warping in the semiconductor wafer poses a problem to a manufacturing process that follows. Especially in a process step to form the conductive terminal 106 by screen printing using the protection film 111 as a mask, accuracy of printing alignment gets worse, resulting in reduced yield or potential deterioration in reliability of the BGA type semiconductor device 101.

SUMMARY OF THE INVENTION

A semiconductor wafer is prevented from warping by forming a film of cushioning material, a protection film or a photoresist film to provide an opening in the protection film by spray coating to make thickness of the film uniform. Accuracy of alignment to form a conductive terminal in subsequent screen printing process is increased to improve yield and reliability of a BGA type semiconductor device.

DETAILED DESCRIPTION OF THE INVENTION

A manufacturing method of a semiconductor device according to an embodiment of this invention will be explained referring to figures hereinafter. FIGS. 1–6 are cross-sectional views showing the manufacturing method of the semiconductor device according the embodiment of this invention.

Figure 1:
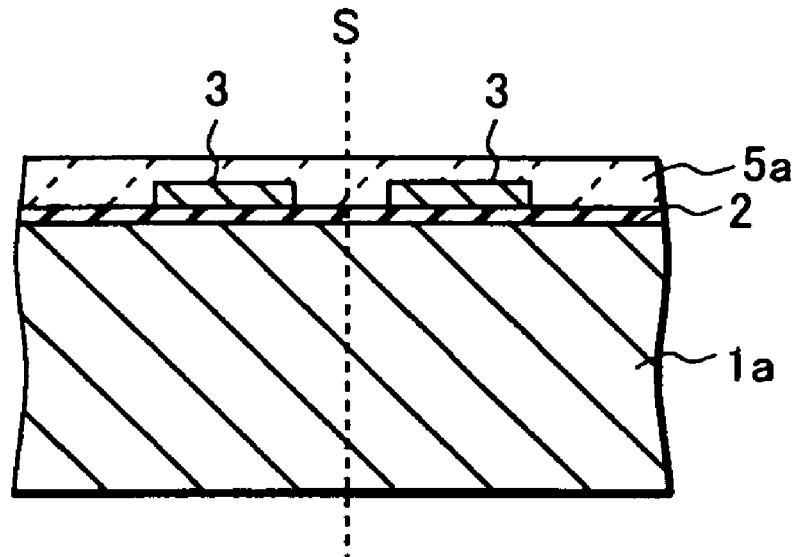
FIG. 1 is a cross-sectional view showing a manufacturing method of a semiconductor device according an embodiment of this invention.

First, a semiconductor wafer 1a having a plurality of semiconductor dice 1 is provided, as shown in FIG. 1. The semiconductor dice 1 are CCD image sensors, for example, and are manufactured by semiconductor wafer processing. A pair of first wirings 3 made mainly of aluminum or copper are formed to be 1 μm thick by sputtering on a insulation film 2 formed on the semiconductor wafer 1a.

Each of the pair of first wirings 3 is formed facing each other across a border line (called a dicing line or a scribe line) S to divide the semiconductor wafer into individual dice. Or, a first wiring 3 may be formed extending across the border line S and divided into a pair of first wirings 3 later on.

Each of the pair of first wirings 3 makes a pad extending from a bonding pad in the semiconductor die 1 to proximity of the border line S. That is, each of the pair of first wirings 3 is a pad for external connection, and is electrically connected with a circuit in the semiconductor die 1 which is not shown in the figure.

Figure 2:
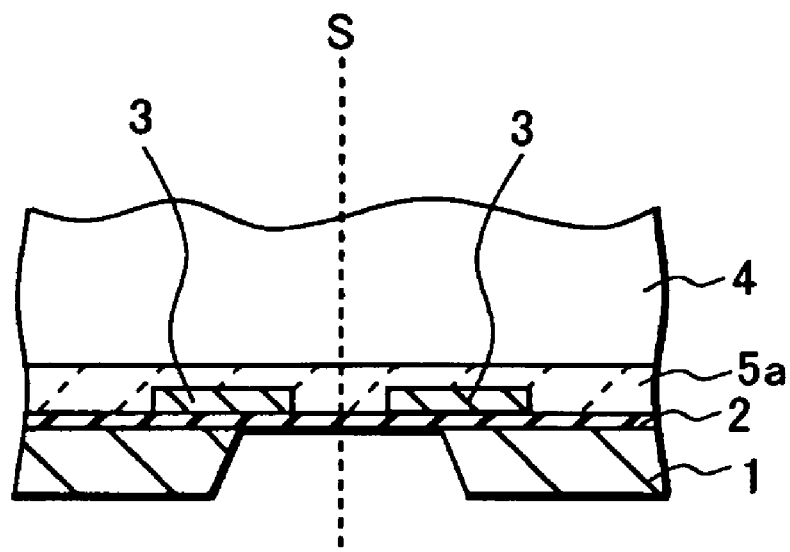
FIG. 2 is a cross-sectional view showing the manufacturing method of the semiconductor device according the embodiment of this invention.

Next, a first glass substrate 4 of thickness of 200 μm is bonded to a top surface of the semiconductor wafer 1a, on which the first wirings 3 have been formed, using a resin 5a made of transparent epoxy material as a binder, as shown in FIG. 2. Then the semiconductor wafer 1a is etched along the border line S from its back surface by dry etching to expose the insulation film 2, after the semiconductor wafer 1a is back-ground to 100 μm in thickness. Although the semiconductor wafer 1a is divided into individual dice 1 by the dry etching, the semiconductor dice 1 are held together with the first glass substrate 4 working as a supporting substrate to keep a shape of a sheet of the semiconductor wafer 1a.

Figure 3:
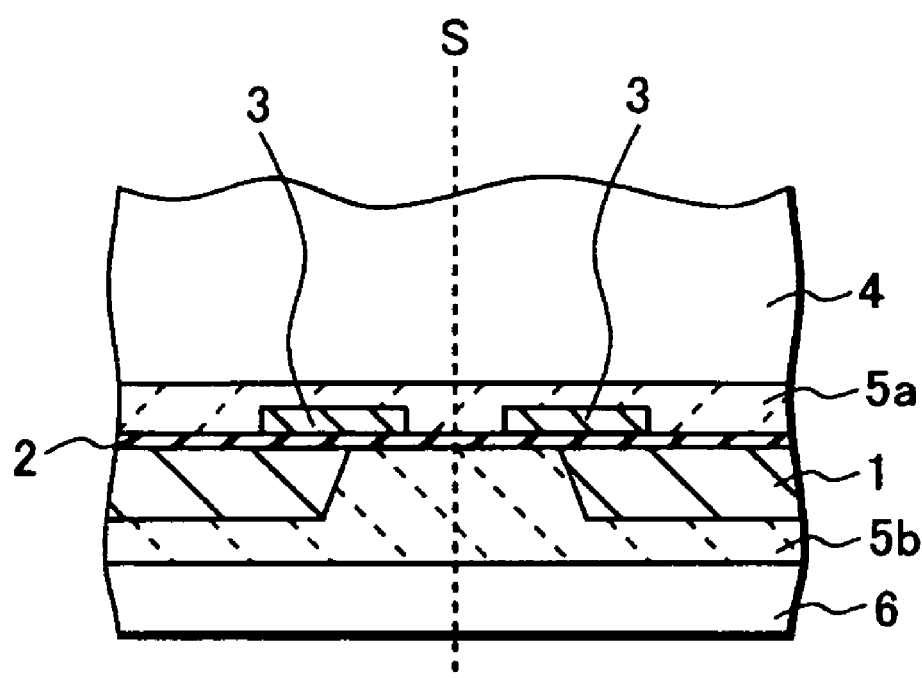
FIG. 3 is a cross-sectional view showing the manufacturing method of the semiconductor device according the embodiment of this invention.

Then another supporting substrate of a second glass substrate 6 of 100 μm in thickness is bonded to the back surface of the semiconductor dice 1 using a resin 5b as a binder, as shown in FIG. 3.

Figure 4A:
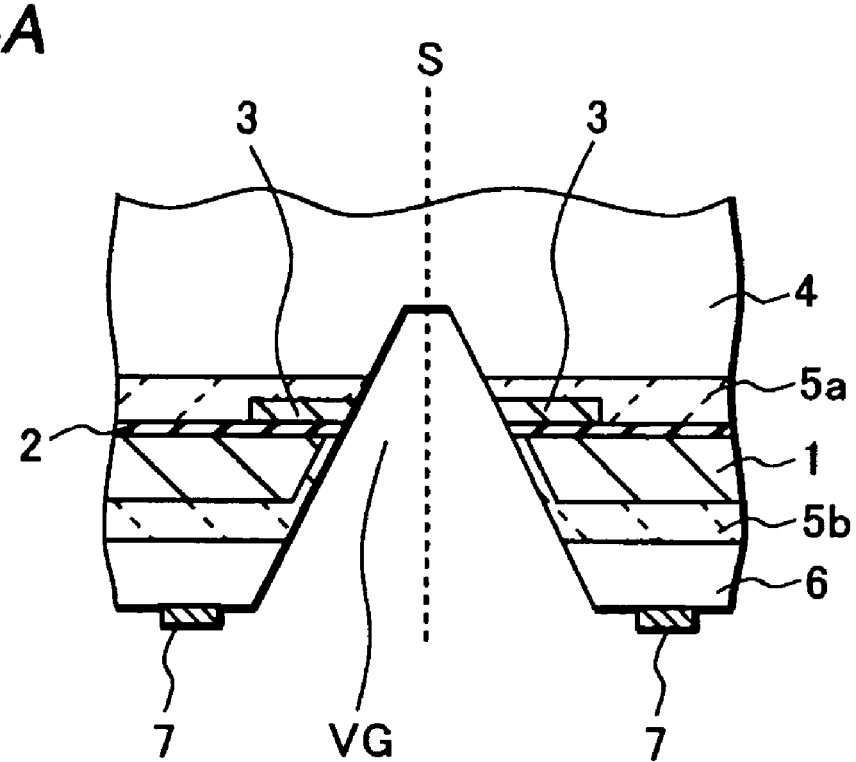
FIGS. 4A and 4B are cross-sectional views showing the manufacturing method of the semiconductor device according the embodiment of this invention.

After that, a cushioning material 7 made of flexible photosensitive organic film is preferably formed on a flat portion at predetermined position on each of the second glass substrates 6, as shown in FIG. 4A. The cushioning material 7 is to absorb a stress applied on a conductive terminal 10, which will be described later, and prevent the glass substrate from cracking. Note that the cushioning material 7 may be made of a material other than the photosensitive organic film, as long as it is flexible.

The cushioning material 7 is formed on the surface of the second glass substrate 6 by coating by spraying (hereafter referred to as spray coating) a film-forming material such as liquid photosensitive organic material toward the surface of the second glass substrate 6 with a spray coater (not shown).

The spray coater is structured to apply pressure on the liquid photosensitive organic material and spray it from a thin nozzle on the surface of the second glass substrate 6, making the photosensitive organic material mist of fine particles. The spray coater may be controlled manually or automatically, as long as it is structured as described above.

Then unwanted portion (portion except for portions at the predetermined positions) of the cushioning material 7 formed on the second glass substrate 6 is removed.

The cushioning material 7 is formed in uniform thickness by the spray coating. Therewith the conductive terminal 10 can be formed at a predetermined position and of a predetermined height, when the conductive terminal 10 is formed above the cushioning material 7 later on. As a result, the stress applied on the conductive terminal 10 is made uniform, preventing cracking and warping of the glass substrate due to the stress from occurring.

After that, notching is made from the back surface of the semiconductor die 1 along the border line S. The notching is made by cutting the semiconductor die 1 from its back surface using a saw-shaped tool such as a blade, for example. The notching is made from the second glass substrate 6 until a part of the first glass substrate 4 is cut so that side edges of the first wirings 3 are exposed on the notched surface. A V-shaped groove VG is formed along the border line S by the notching. Since the exposed surface is contaminated by the notching in some cases, the exposed surface may be cleaned by dry etching if necessary.

The notching is made after forming the cushioning material 7 in the embodiment described above. Not limited to that, the cushioning material 7 may be formed after the notching process by spray coating. Since the cushioning material 7 is formed uniform in thickness over the surface including the surface of the V-shaped groove VG without accumulating thick in a bottom of the V-shaped groove VG, consumption of the photosensitive organic material is reduced as much as possible in this case also. Besides, the semiconductor wafer 1a is prevented from warping, because the photosensitive organic material is formed uniform in thickness without becoming thick in the bottom of the V-shaped groove VG.

Figure 4B:
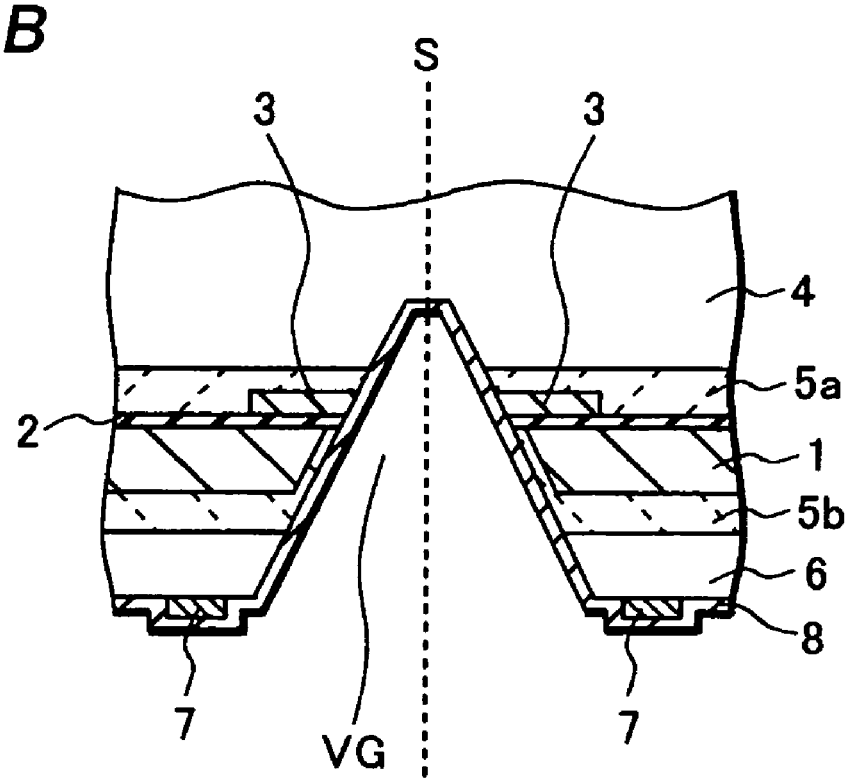

Next, a metal layer of thickness of about 3 μm made mainly of aluminum or copper is formed to cover the second glass substrate 6 and the V-shaped groove VG formed by the notching, as shown in FIG. 4B. Then, patterning is made on the metal layer 8 to form a second wiring 8 which is electrically connected with the exposed side edge of the first wiring 3. Ni (nickel) and Au (gold) plating (not shown) is formed on the surface after the second wiring 8 is formed. The second wiring 8 extends over the surface of the second glass substrate 6 on the back surface of the semiconductor die 1. The conductive terminal 10, which will be described later, is formed on the second wiring 8 extended over the surface of the second glass substrate 6.

Figure 5:
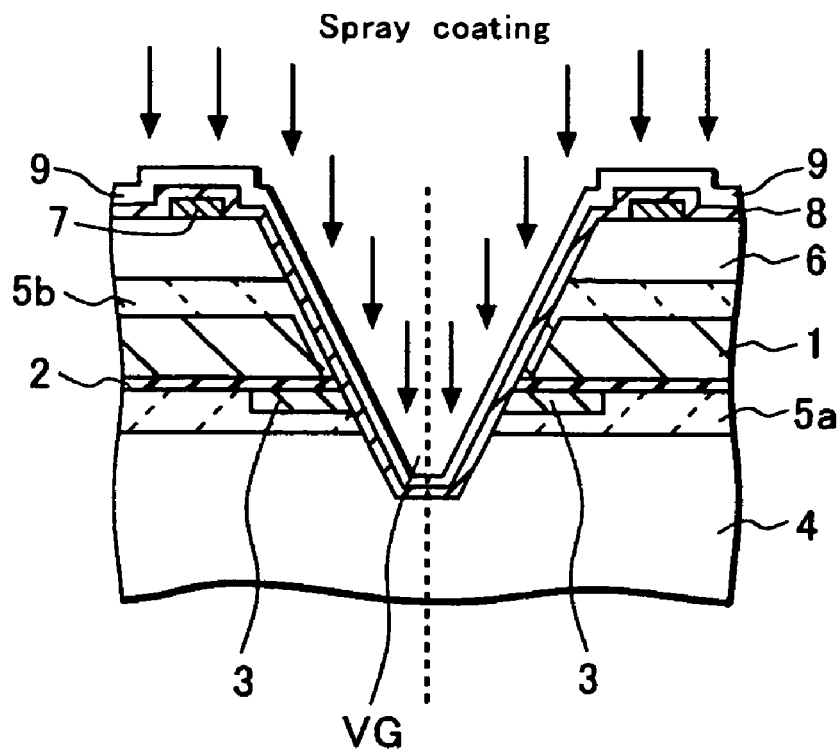
FIG. 5 is a cross-sectional view showing the manufacturing method of the semiconductor device according the embodiment of this invention.

Next, a protection film 9 is formed on the second wiring 8, as shown in FIG. 5. The protection film 9 works as a solder mask in later process step of screen printing. The protection film 9 is formed on the surface of the second wiring 8 by spray coating an organic resin such as an epoxy resin, for example, with a spray coater (not shown) in direction indicated with arrows in the figure, that is, toward the surface of the second wiring 8.

The spray coater is structured to apply pressure on the liquid organic resin and spray it from a thin nozzle on the surface of the second wiring 8, making the organic resin mist of fine particles. The spray coater may be controlled manually or automatically, as long as it is structured as described above.

Since the protection film 9 is formed to have uniform thickness on the surface including the V-shaped groove VG without becoming a thick pile in the bottom of the V-shaped groove VG, consumption of the organic resin is reduced as much as possible.

When a thermosetting resin is used as the organic resin, the protection film 9 is hardened by baking at predetermined temperature after spray coating the protection film 9. Unlike in the case of the conventional art, warping of the semiconductor wafer 1a does not occur in this case, since the protection film 9 is formed to have uniform thickness without becoming thick in the bottom of the V-shaped groove VG. The protection film 9 may be formed of a photoresist material.

Next, an opening K is formed at predetermined position in the protection film 9 above the second glass substrate 6 to expose the second wiring 8, so that the conductive terminal 10, which will be described later, is formed in the opening K. The opening K is formed above the cushioning material 7, when the cushioning material 7 is provided. The opening K is formed using a photoresist layer R as described below.

Figure 6:
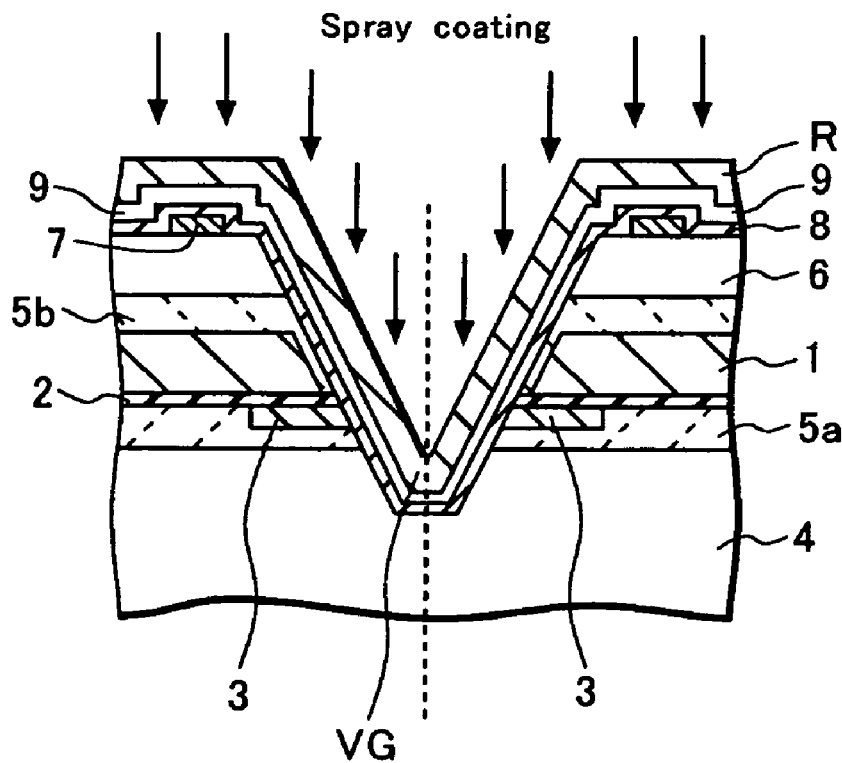
FIG. 6 is a cross-sectional view showing the manufacturing method of the semiconductor device according the embodiment of this invention.

As shown in FIG. 6, the photoresist layer R is formed on the protection film 9 by spray coating a liquid photoresist material, for example, in direction as indicated with arrows in the figure, that is, toward a surface of the protection film 9. Forming the photoresist layer R by spray coating is done with a spray coater (not shown).

The spray coater is structured to apply pressure on the liquid photoresist material and spray it from a thin nozzle on the surface of the protection film 9, making the photoresist material mist of fine particles. The spray coater may be controlled manually or automatically, as long as it is structured as described above.

Since the photoresist layer R is formed to have uniform thickness on the surface including the V-shaped groove VG without becoming thick in the bottom of the V-shaped groove VG, consumption of the photoresist material is reduced as much as possible.

When a thermosetting resin is used as the photoresist material, the photoresist layer R is hardened by baking at predetermined temperature after spray coating the photoresist layer R. Unlike in the case of the conventional art, warping of the semiconductor wafer 1a does not occur in this case, since the photoresist layer R is formed to have uniform thickness without accumulating thick in the bottom of the V-shaped groove VG.

Figure 7:
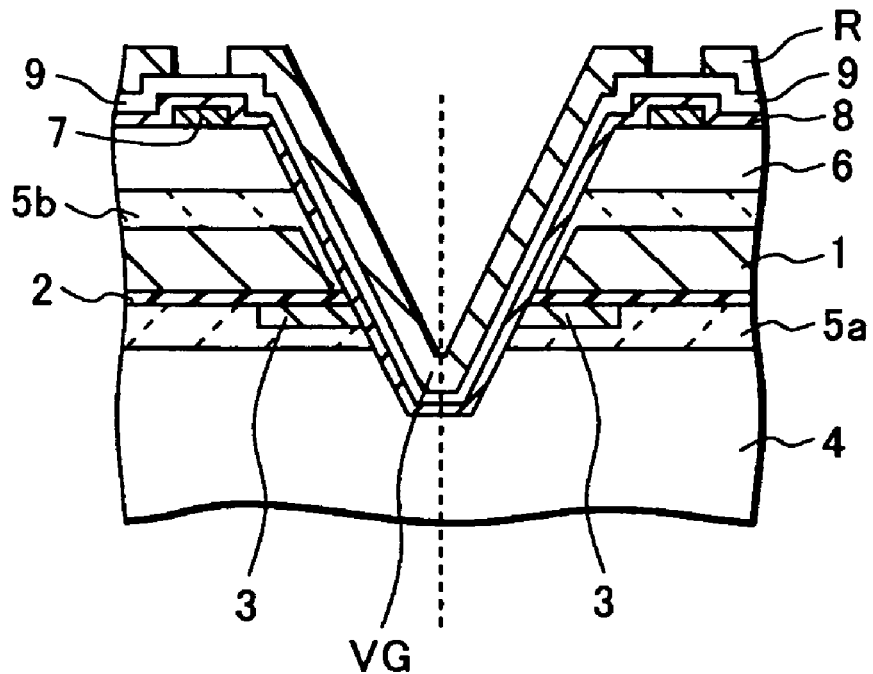
FIG. 7 is a cross-sectional view showing the manufacturing method of the semiconductor device according the embodiment of this invention.
Figure 8:
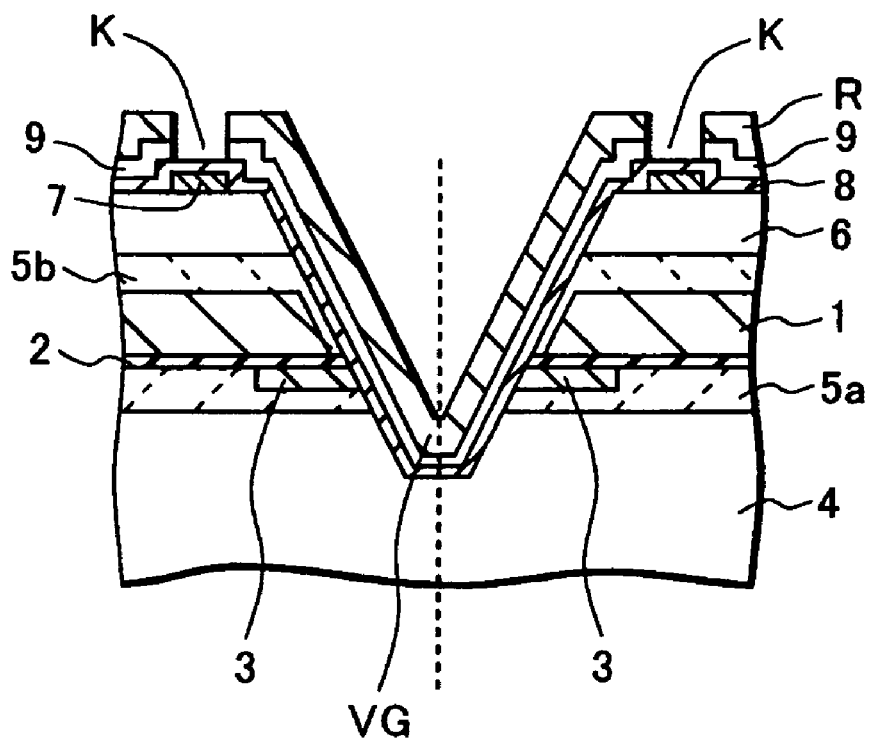
FIG. 8 is a cross-sectional view showing the manufacturing method of the semiconductor device according the embodiment of this invention.
Figure 9:
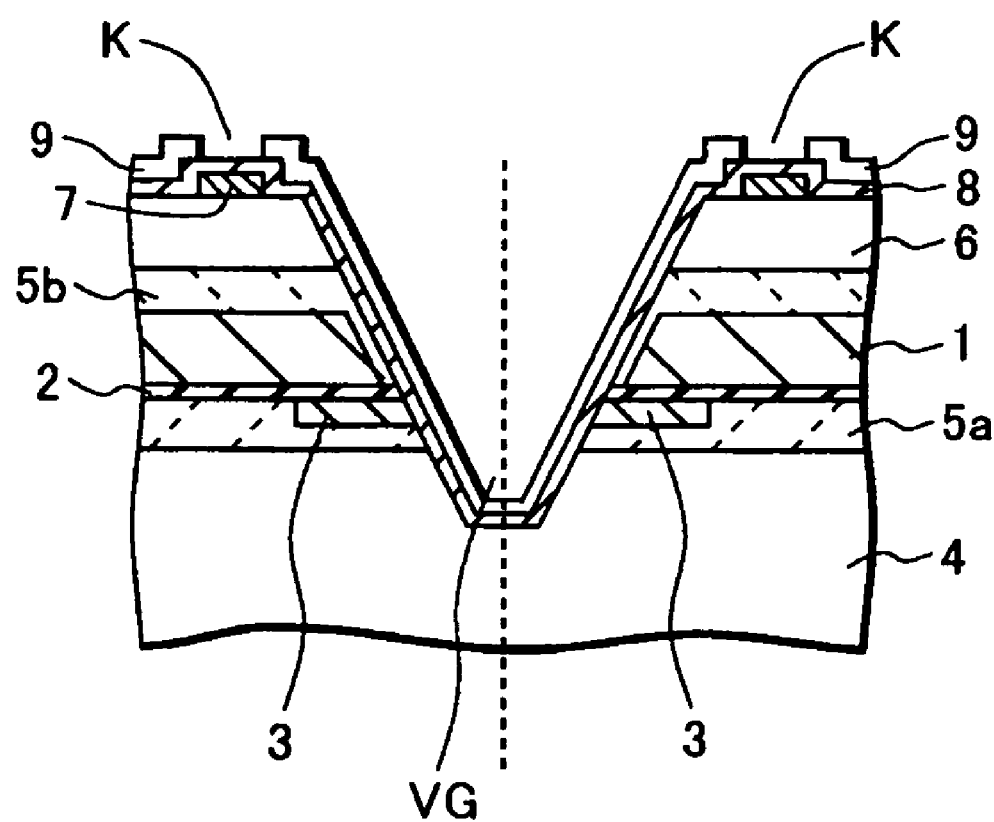
FIG. 9 is a cross-sectional view showing the manufacturing method of the semiconductor device according the embodiment of this invention.

Next, as shown in FIG. 7, portions of the photoresist layer R above the cushioning material 7 are removed by exposure using a mask (not shown) and development. Then, portions of the protection film 9 are removed by etching using the photoresist layer R as a mask, from which above-mentioned portions are removed, so that the openings K are formed to expose the second wiring 8, as shown in FIG. 8. After that, the photoresist layer R is removed, as shown in FIG. 9.

Figure 10A:
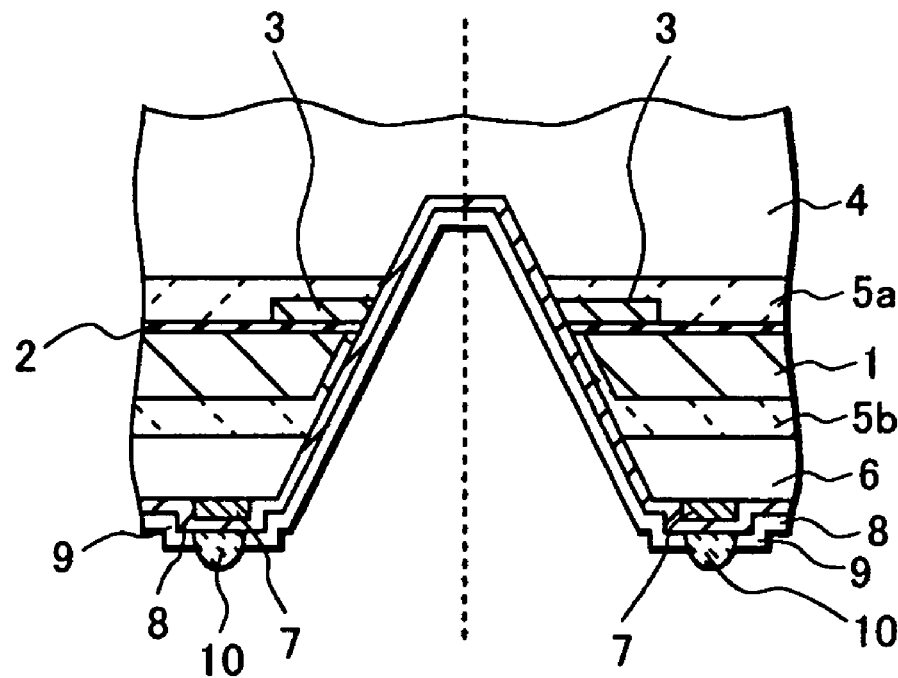
FIGS. 10A and 10B are cross-sectional views showing the manufacturing method of the semiconductor device according the embodiment of this invention.

Next, the conductive terminals 10 made of metal such as solder are formed on the second wiring 8 exposed in the openings K, by screen printing using the protection film 9 with the openings K as a mask, as shown in FIG. 10A. Each of the conductive terminals 10 is disposed above the cushioning material 7, when the cushioning material 7 is provided.

The screen printing is made with high accuracy, since the warping in the semiconductor wafer 1a is suppressed compared with the conventional art. That is, yield and reliability of the BGA type semiconductor device are improved with this embodiment by improving accuracy of processing such as the screen printing which requires flatness of the semiconductor wafer.

After that, a reflow process is performed. Therewith the conductive terminals 10 are made ball-shaped.

Figure 10B:
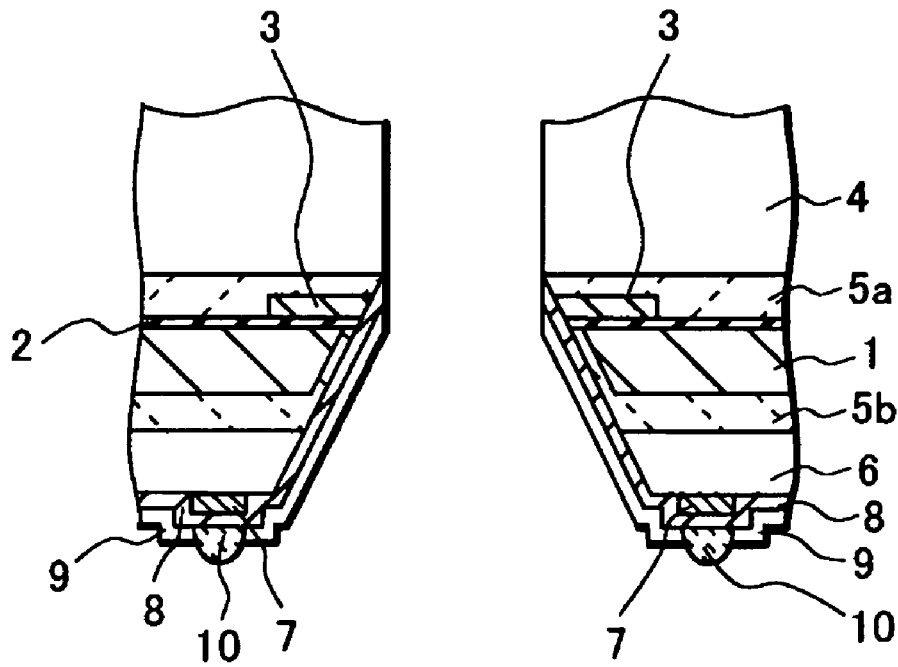
Figure 11A:
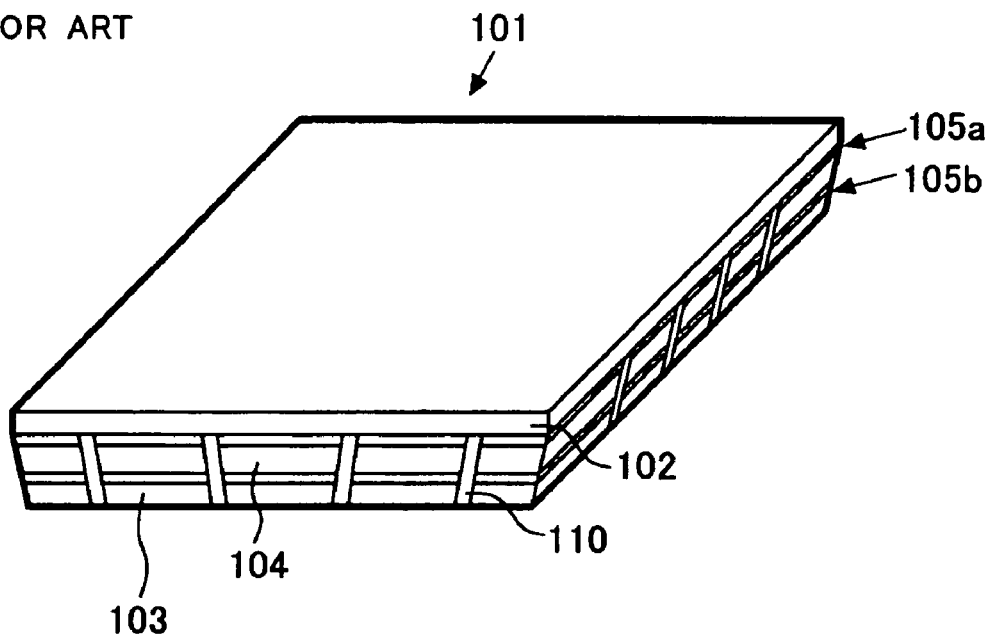
FIGS. 11A and 11B are oblique perspective views showing a manufacturing method of a semiconductor device according to a conventional art.
Figure 11B:
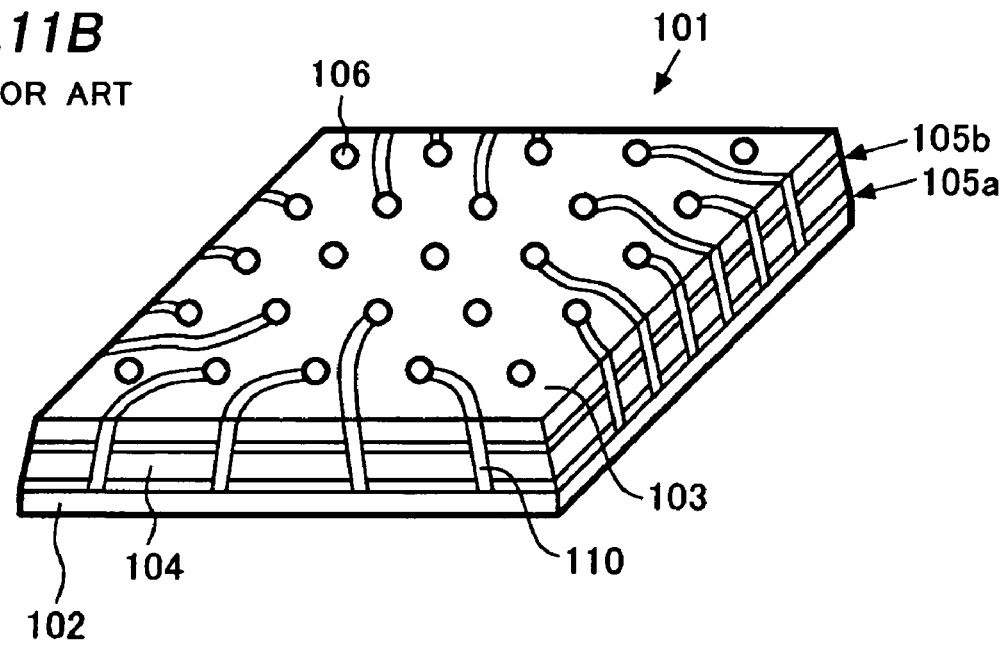
Figure 12:
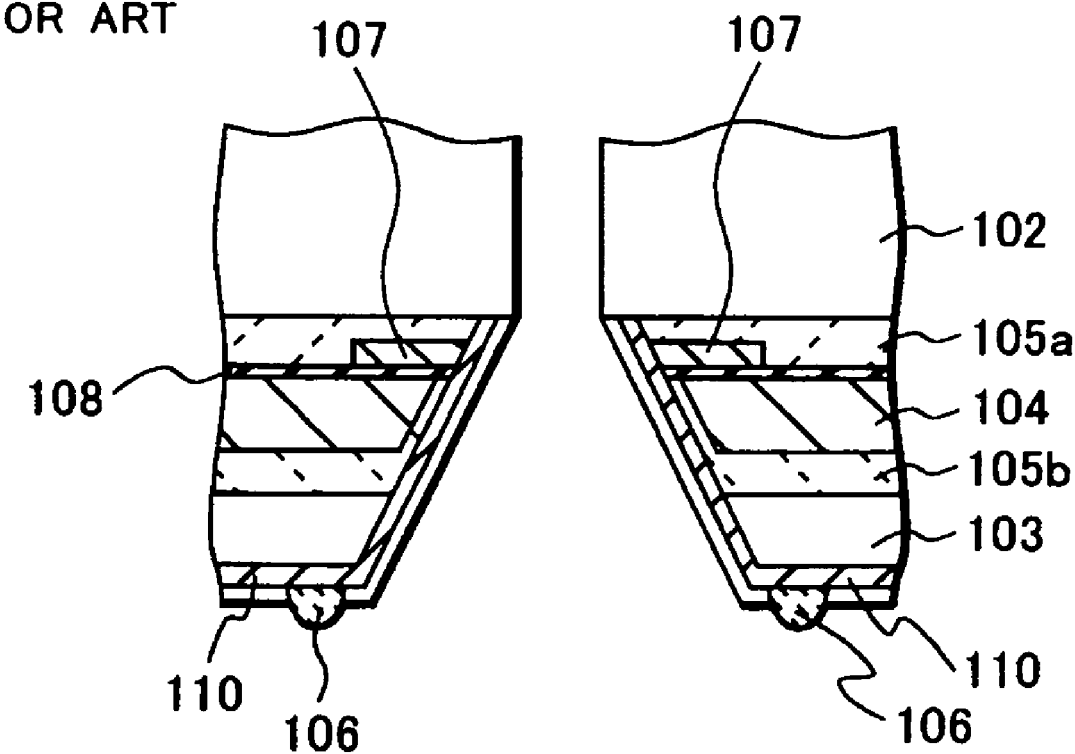
FIG. 12 is a cross-sectional view showing the manufacturing method of the semiconductor device according to the conventional art.
Figure 13A:
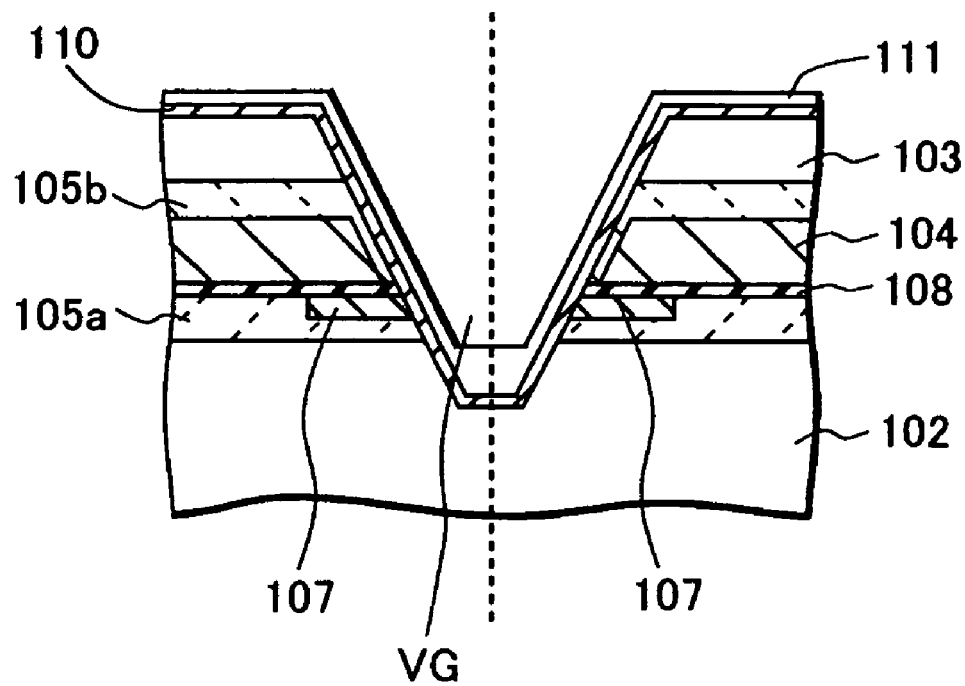
FIGS. 13A and 13B are cross-sectional views showing the manufacturing method of the semiconductor device according to the conventional art.
Figure 13B:
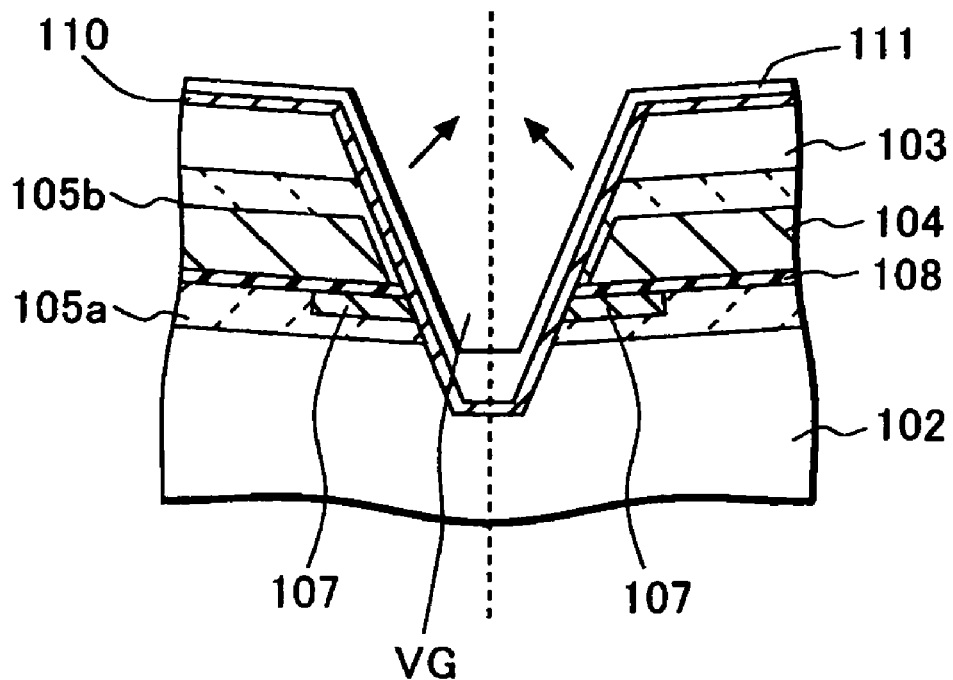

Next, the semiconductor wafer 1a is diced along the dicing lines S into individual semiconductor dice 1, as shown in FIG. 10B. With this, the BGA type semiconductor device is completed.

The photoresist layer R to form the openings K is formed on the protection film 9 by spray coating in the embodiment described above. This invention is not limited to that. That is, when a photoresist layer is used as a masking material in any other process step, the photoresist layer may be formed by spray coating.

Although the first glass substrate 4 and the second glass substrate 6 are bonded to the semiconductor wafer 1a in the embodiment to secure reliability, the second glass substrate 6 may be omitted to simplify the manufacturing process. In this case, the groove is formed by etching the semiconductor wafer 1a along the border line S from its back surface to expose the first wirings 3, after back grinding the semiconductor wafer 1a as described referring to FIG. 2. The etching is made using a photoresist layer which is formed by spray coating a photoresist material on the back surface of the semiconductor wafer 1a.

If the cushioning material 7 is to be provided on the back surface of the semiconductor die, the cushioning material 7 is formed on the back surface of the semiconductor wafer 1a by spray coating. Furthermore, the protection film 9 is formed on the second wiring 8 by spray coating, after the second wiring 8 is formed on the back surface of the semiconductor wafer 1a (semiconductor die 1).

This invention is applied to the BGA type semiconductor device which has conductive terminals on the back surface of the semiconductor die in the embodiments described above. Not limited to that, this invention may also be applied to a so-called LGA (Land Grid Array) type semiconductor device which has no conductive terminal on the back surface of the semiconductor die. That is, the semiconductor device is formed to have the protection film 9 on the surface of the second wiring 8, but not to have the conductive terminal 10 in the opening K in the protection film 9.

When this invention is applied to form the film of the cushioning material, the protection film or the film of the photoresist layer, each of the films mentioned above is formed to have uniform thickness, since the method of this embodiment uses spray coating in which the material to form the film is sprayed making mist of fine particles. When the protection film or the photoresist layer is baked, the semiconductor wafer is prevented from warping, because localized severe shrinking of the protection film or the photoresist layer is suppressed. Yield and reliability of the BGA type semiconductor device are improved with this embodiment by improving accuracy of processing such as the screen printing which requires flatness of the semiconductor wafer.

What is claimed is:

1. A manufacturing method of a semiconductor device, comprising:
    bonding a first supporting substrate to a top surface of a semiconductor wafer, a first wiring being formed on the top surface;
    bonding a second supporting substrate to a back surface of the semiconductor wafer;
    forming a groove to expose a portion of the first wiring by cutting the second supporting substrate, the semiconductor wafer and the first supporting substrate from a surface of the second supporting substrate, the groove reaching inside the first supporting substrate;
    forming a second wiring connected to the exposed portion of the first wiring and extending over the surface of the second supporting substrate;
    forming a protection film on a surface of the second wiring by spray coating; and
    forming an opening in the protection film at a predetermined position to expose the second wiring.

2. A manufacturing method of a semiconductor devices comprising:
    bonding a first supporting substrate to a top surface of a semiconductor wafer, a first wiring being formed on the top surface;
    bonding a second supporting substrate to a back surface of the semiconductor wafer;
    forming a cushioning portion on the second supporting substrate by spray coating;
    forming a groove to expose a portion of the first wiring by cutting the second supporting substrate, the semiconductor wafer and the first supporting substrate from a surface of the second supporting substrate, the groove reaching inside the first supporting substrate;
    forming a second wiring connected to the exposed portion of the first wiring and extending over the surface of the second supporting substrate and the cushioning portion;
    forming a protection film on a surface of the second wiring; and
    forming an opening in the protection film at a predetermined position to expose the second wiring.

3. The manufacturing method of a semiconductor device of claim 1 or 2, further comprising forming a photoresist layer on the protection film by spray coating.

4. The manufacturing method of a semiconductor device of claim 1 or 2, further comprising forming a conductive terminal on the second wiring exposed through the opening in the protection film.

5. A manufacturing method of a semiconductor device, comprising:
    bonding a supporting substrate to a top surface of a semiconductor wafer, a first wiring being formed on the top surface;
    forming a groove to expose a portion of the first wiring by etching the semiconductor wafer from a back surface of the semiconductor wafer;
    forming a second wiring connected to the exposed portion of the first wiring and extending over the back surface of the semiconductor wafer;
    forming a protection film on a surface of the second wiring by spray coating; and
    forming an opening in the protection film at a predetermined position to expose the second wiring.

6. A manufacturing method of a semiconductor device, comprising:
    bonding a supporting substrate to a top surface of a semiconductor wafer, a first wiring being formed on the top surface;
    forming a groove to expose a portion of the first wiring by etching the semiconductor wafer from a back surface of the semiconductor wafer;
    forming a cushioning portion on the back surface of the semiconductor wafer by spray coating;
    forming a second wiring connected to the exposed portion of the first wiring and extending over the back surface of the semiconductor wafer and the cushioning portion;
    forming a protection film on a surface of the second wiring; and
    forming an opening in the protection film at a predetermined position to expose the second wiring.

7. The manufacturing method of a semiconductor device of claim 5 or 6, further comprising forming a photoresist layer on the protection film by spray coating.

8. The manufacturing method of a semiconductor device of claim 5 or 6, further comprising forming a conductive terminal on the second wiring exposed through the opening in the protection film.

9. The manufacturing method of a semiconductor device of claim 1, 2, 5 or 6, wherein the protection film comprises an organic resin.

10. The manufacturing method of a semiconductor device of claim 9, wherein the organic resin comprises an epoxy resin or is made of a photoresist material.

11. The manufacturing method of a semiconductor device of claim 9, wherein the organic resin comprises a thermosetting resin.

12. A manufacturing method of a semiconductor device, comprising:
    bonding a first supporting substrate to a top surface of a semiconductor wafer, a first wiring being formed on the top surface;
    dividing the semiconductor wafer into a plurality of semiconductor dice by etching the semiconductor wafer along a dicing line from a back surface of the semiconductor wafer;
    bonding a second supporting substrate to back surfaces of the plurality of semiconductor dice through a resin layer;
    forming a groove to expose a portion of the first wiring by cutting the second supporting substrate, the resin layer and the first supporting substrate along the dicing line from a surface of the second supporting substrate, the groove reaching inside the first supporting substrate;
    forming a second wiring connected to the exposed portion of the first wiring and extending over the surface of the second supporting substrate;
    forming a protection film on a surface of the second wiring by spray coating; and
    forming an opening in the protection film at a predetermined position to expose the second wiring.

13. A manufacturing method of a semiconductor device, comprising:
    bonding a first supporting substrate to a top surface of a semiconductor wafer, a first wiring being formed on the top surface;

dividing the semiconductor wafer into a plurality of semiconductor dice by etching the semiconductor wafer along a dicing line from a back surface of the semiconductor wafer;

bonding a second supporting substrate to back surfaces of the plurality of semiconductor dice through a resin layer;

forming a cushioning portion on the second supporting substrate by spray coating;

forming a groove to expose a portion of the first wiring by cutting the second supporting substrate, the resin layer and the first supporting substrate along the dicing line from a surface of the second supporting substrate, the groove reaching inside the first supporting substrate;

forming a second wiring connected to the exposed portion of the first wiring and extending over the surface of the second supporting substrate and the cushioning portion;

forming a protection film on a surface of the second wiring; and forming an opening in the protection film at a predetermined position to expose the second wiring.

14. The manufacturing method of a semiconductor device of claim 12 or 13, further comprising forming a photoresist layer on the protection film by spray coating.

15. The manufacturing method of a semiconductor device of claim 12 or 13, further comprising forming a conductive terminal on the second wiring exposed through the opening of the protection film.

16. The manufacturing method of a semiconductor device of claim 12 or 13, wherein the protection film comprises an organic resin.

17. The manufacturing method of a semiconductor device of claim 16, wherein the organic resin comprises an epoxy resin or is made of a photoresist material.

18. The manufacturing method of a semiconductor device of claim 16, wherein the organic resin comprises a thermosetting resin.

19. The manufacturing method of a semiconductor device of claim 1, 2, 5, 6, 12 or 13, further comprising forming a photoresist layer by spray coating.

* * * * *